United States Patent [19]
Todsen et al.

[11] Patent Number: 5,905,398
[45] Date of Patent: May 18, 1999

[54] CAPACITOR ARRAY HAVING USER-ADJUSTABLE, MANUFACTURER-TRIMMABLE CAPACITANCE AND METHOD

[75] Inventors: James L. Todsen; Timothy V. Kalthoff, both of Tucson, Ariz.

[73] Assignee: Burr-Brown Corporation, Tucson, Ariz.

[21] Appl. No.: 08/827,725

[22] Filed: Apr. 8, 1997

[51] Int. Cl.$^6$ .................................................. H03M 1/12
[52] U.S. Cl. ........................ 327/337; 327/344; 341/172; 341/121
[58] Field of Search ................................... 327/361, 356, 327/337, 339, 344, 345, 71, 74, 75, 525; 330/282; 341/172, 121; 365/96, 225.7

[56] References Cited

U.S. PATENT DOCUMENTS

| | | | |
|---|---|---|---|
| 4,468,654 | 8/1984 | Kapral | 340/347 |
| 4,567,465 | 1/1986 | Komiya | 340/347 |
| 4,654,815 | 3/1987 | Marin et al. | 364/606 |
| 4,709,225 | 11/1987 | Welland et al. | 340/347 |
| 4,814,640 | 3/1989 | Miyake | 307/303 |
| 4,905,005 | 2/1990 | Arribard et al. | 341/139 |
| 4,989,002 | 1/1991 | Tan | 341/120 |
| 4,999,633 | 3/1991 | Draxelmayr | 341/120 |
| 5,012,247 | 4/1991 | Dillman | 341/172 |
| 5,012,808 | 5/1991 | Stubbers et al. | 128/419 |
| 5,027,116 | 6/1991 | Armstrong et al. | 341/120 |
| 5,051,707 | 9/1991 | Fujita | 330/279 |
| 5,134,401 | 7/1992 | McCartney et al. | 341/143 |
| 5,187,445 | 2/1993 | Jackson | 307/521 |
| 5,229,772 | 7/1993 | Hamlon | 341/172 |
| 5,235,335 | 8/1993 | Hester et al. | 341/172 |
| 5,258,760 | 11/1993 | Moody et al. | 341/166 |
| 5,359,383 | 10/1994 | Miida et al. | 354/402 |
| 5,363,102 | 11/1994 | Ferguson | 341/172 |
| 5,541,600 | 7/1996 | Blumenkrantz et al. | 341/139 |
| 5,574,678 | 11/1996 | Gorecki | 364/807 |
| 5,581,252 | 12/1996 | Thomas | 341/144 |

OTHER PUBLICATIONS

"An Electrically–Programmable Switched Capacitor Filter", by David J. Allstot, Robert W. Brodersen and Paul R. Gray, IEEE Journal of Solid–State Circuits, vol. SC–14, No. 6, Dec. 1979.

*Primary Examiner*—Timothy P. Callahan
*Assistant Examiner*—Eunja Shin
*Attorney, Agent, or Firm*—Cahill, Sutton & Thomas P.L.C.

[57] ABSTRACT

A programmable integrated circuit capacitor array includes a plurality of binarily weighted capacitors (16) and a plurality of switches (18) selectively coupling the capacitors in parallel between first and second terminals. A control circuit (10) responds to a plurality of capacitance selection inputs (CS0,1,2) in conjunction with a plurality of trim inputs (TR0,1) and a sign input (TRS) to produce a plurality of selection signals (SEL0,1 ... 7) on control electrodes of the switches to couple one or more of the capacitors and thereby provide an accurate value of the desired capacitance between the first and second terminals despite any manufacturing deviations in capacitance per unit area.

20 Claims, 3 Drawing Sheets

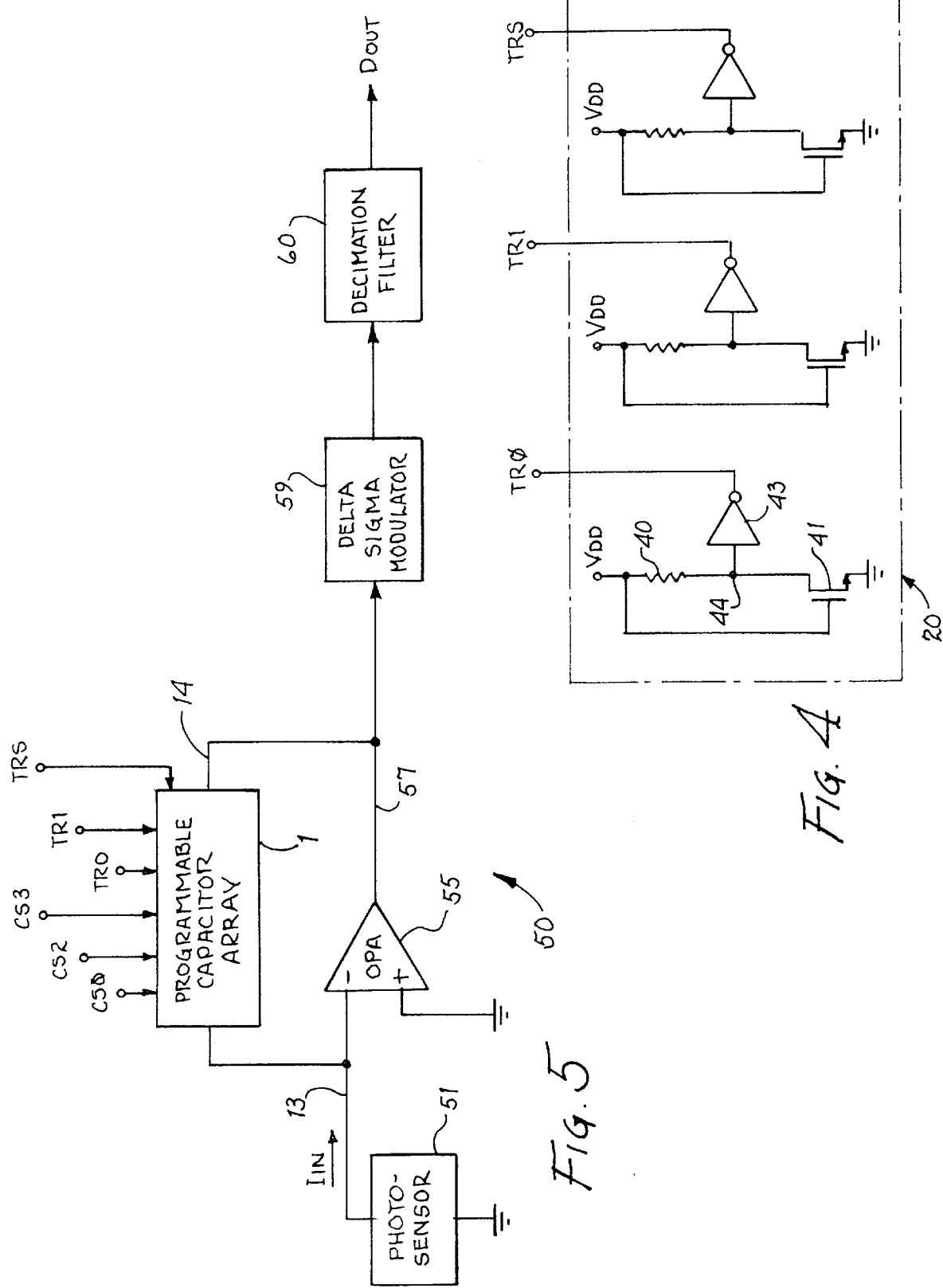

CAPACITOR ARRAY HAVING USER-ADJUSTABLE, MANUFACTURER-TRIMMABLE CAPACITANCE AND METHOD

BACKGROUND OF THE INVENTION

The invention relates to a user-adjustable capacitor array that is manufacturer-trimmable to compensate for variations in absolute capacitance values, and more particularly to such a capacitor array which can be implemented in an integrated circuit using a minimum number of elements, and more particularly to such a capacitor array used as an integrating capacitor in a front-end integrator to an analog-to-digital converter, such as a delta-sigma analog-to-digital converter.

There are various applications in which a user-adjustable integrated circuit capacitor is needed. For example, in the front-end integrator to an analog-to-digital converter it may be desirable to have user-adjustable gain. The absolute value of the integration capacitor (rather than a ratio of capacitances) sets the overall gain of the circuit including the front-end integrator and the analog-to-digital converter. Unfortunately, the value of capacitance per unit area in ordinary integrated circuit manufacturing processes is usually not well controlled. Therefore, if an accurate value of capacitance is needed for an integrated circuit capacitor, the manufacturer must "trim" the capacitor as needed to compensate for the large variations inherent in ordinary integrated circuit manufacturing processes.

One well known way of trimming the value of an integrated circuit capacitor is to provide an array in which a main capacitor of somewhat smaller than "nominal" capacitance is initially in parallel with a number of smaller "trim" capacitors, which then can be removed from parallel connection with the main capacitor by "trimming", for example by using a laser to cut electrical connections which directly or indirectly remove one or more of the trim capacitors from parallel connection to the main capacitor. This technique has the significant drawback that it always requires that there be a capacitor trimming operation, even if the integrated circuit manufacturing process succeeds in providing exactly the desired or nominal capacitance per unit area of the integrated capacitors. This adds considerable unnecessary expense if the manufacturing process frequently succeeds in achieving "on target" capacitance per unit area. Another problem of this technique is that it is not well suited to use in a user-adjustable capacitor array because each user-adjustable capacitance value has to be separately trimmed.

U.S. Pat. No. 5,258,760 (Moody et al.) discloses a programmable integrator including both a programmable capacitor array and a programmable resistive voltage divider connected in series to form the integrating feedback element. This reference teaches that the provision of a dual-programmable feature permits a calibration adjustment of the integrator constant to compensate for component parameter variations in the resistance of a polycrystaline silicon integrating resistor. This approach to a programmable integrator adds considerable complexity and chip area to the integrator, and undesirably requires the operational amplifier to drive the programmable voltage divider.

It would be desirable to provide an improved integrated circuit capacitor array in which a desired absolute value of capacitance can be selected to appear between two terminals by a digital capacitance selection code, irrespective of deviations from nominal of the capacitance per unit area of the capacitors in the array.

SUMMARY OF THE INVENTION

Accordingly, it is an object of the invention to provide an integrated circuit including a programmable, trimmable capacitor array which allows user selection of a desired absolute value of capacitance despite manufacturing deviations of capacitance per unit area from a nominal value.

It is another object of the invention to provide a programmable, trimmable integrated circuit capacitor array which avoids the need for a trimming operation if nominal capacitance per unit area specifications are achieved by the integrated circuit manufacturing process.

It is another object of the invention to provide a programmable, trimmable integrated circuit capacitor array that requires a minimum number of selectable capacitors and a minimum amount of integrated circuit chip area to provide a predetermined a number of accurate selectable capacitance values within a predetermined range.

It is another object of the invention to provide a low cost programmable, trimmable integrated capacitor array in which a single trim operation in effect provides the trimming needed for every selectable capacitance of the array.

Briefly described, and in accordance with one embodiment thereof, the invention provides an integrated circuit capacitor array having first and second ports and presenting a selectable desired capacitance between the first and second ports, including a plurality of capacitors (16) each having a control electrode, a first main electrode, and a second main electrode, one of the first and second main electrodes of each switch being coupled to one of the first and second ports, the other of the first and second main electrodes of that switch being coupled to one of the first and second terminals of a corresponding one of the capacitors, a control circuit (10) having a plurality of capacitance selection inputs (CS0,1,2) representing the desired capacitance, a plurality of trim inputs (TR0,1) representing a deviation from nominal of the capacitances of the capacitors, and a sign input (TRS) the control circuit producing a plurality of selection signals (SEL0,1 . . . 7) on the control electrodes of the plurality of switches, respectively, in response to the plurality of capacitance selection inputs in conjunction with the plurality of trim inputs and the sign input to select one or more of the switches and the capacitors coupled thereto to couple the selected capacitors in parallel between the first and second ports and thereby provide between the first and second ports an accurate value of the desired capacitance despite any deviations from nominal of the capacitances of the capacitors. In the described embodiment the plurality of capacitance selection inputs are external inputs of an integrated circuit containing the integrated circuit capacitor array to select a predetermined number of capacitances between the first and second ports, each predetermined capacitance corresponding to a different combination of the logic states of the plurality of capacitance selection inputs depending on variations from nominal of the capacitance per unit area of the capacitors. The plurality of trim inputs and the sign input are internal inputs of the integrated circuit and are settable according to whether or not a laser-cuttable link is cut during manufacture of the integrated circuit. In the described embodiment, the control circuit includes a first adder summing outputs of the gates to produce a digital number representing a digital product of the capacitance selection inputs and the trim inputs, an exclusive OR circuit receiving the digital number and the sign input to combine the sign input with the digital number, and a second adder which in accordance with the sign input effectively adds or subtracts the digital number to or from a digital number representing the capacitance selection inputs and the sign input to provide between the first and second ports an accurate value of the desired capacitance selected by the plurality of capacitance selection inputs depending on deviations from nominal of the capacitances of the capacitors. In one described embodiment the capacitor array is included in a front-end integrator to an analog-to-digital converter. The front-end integrator includes an operational amplifier having an inverting input, a non-inverting input coupled to a reference voltage conductor, and an output, and the first and second ports being coupled to the inverting input and the output, respectively.

BRIEF DESCRIPTION OF THE DRAWINGS

FIG. 4 is a schematic diagram of circuitry to generate the manufacturer-selectable trim inputs TR0, TR1, and TRS by cutting links with a laser.

FIG. 5 is a schematic diagram of a delta-sigma analog-to-digital converter including a front-end integrator including the user-adjustable, manufacturer-trimmable capacitor array of the present invention to provide user-adjustable gain.

DETAILED DESCRIPTION OF THE PREFERRED EMBODIMENTS

Figure 1:
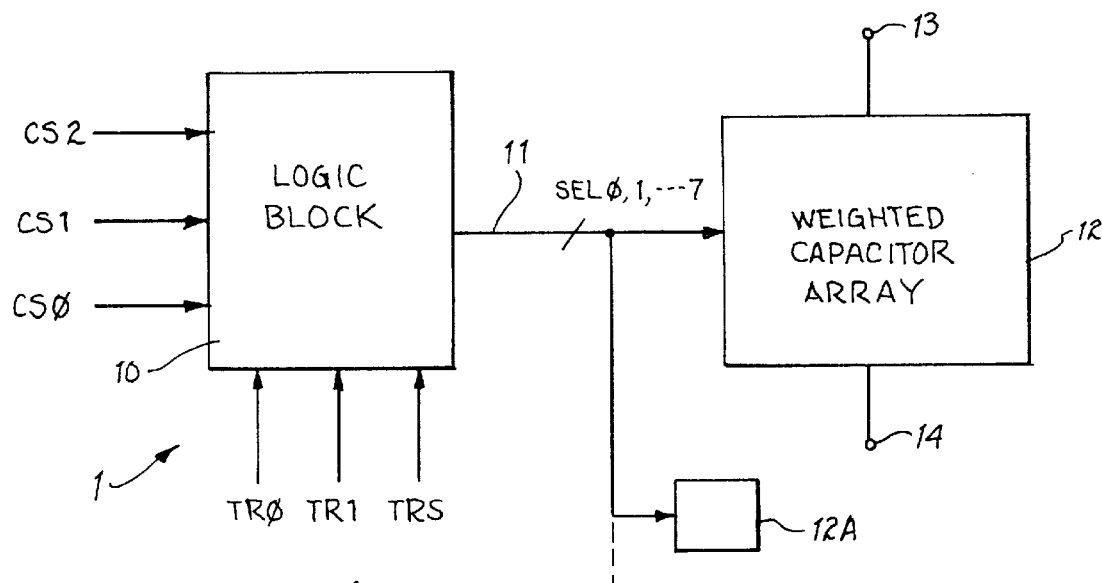
FIG. 1 is a block diagram of the user-adjustable, manufacturer-trimmable integrated circuit capacitor array of the present invention.

FIG. 1 shows an integrating capacitor array circuit 1 including a logic circuit 10 which includes three user-selectable capacitance selection inputs CS0, CS1, and CS2 and three manufacturer-adjustable capacitance trim inputs TR0, TR1, and TRS. In response to all of these digital inputs logic circuit 10 produces eight capacitor array selection signals SEL0,SEL1, ... SEL7 on eight conductors 11, respectively. SEL0,1,2 ... 7 are applied as inputs to parallel-connect various combinations of eight bit binarily weighted capacitors to produce an accurate absolute value of capacitance $C_{INT}$ between terminals 13 and 14 thereof irrespective of deviations of the capacitance per unit area of such capacitors in the array from a nominal value. The circuitry in binarily weighted capacitor array 12 is shown in FIG. 2, and the circuitry in control circuit 10 is shown in FIG. 3.

Figure 2:
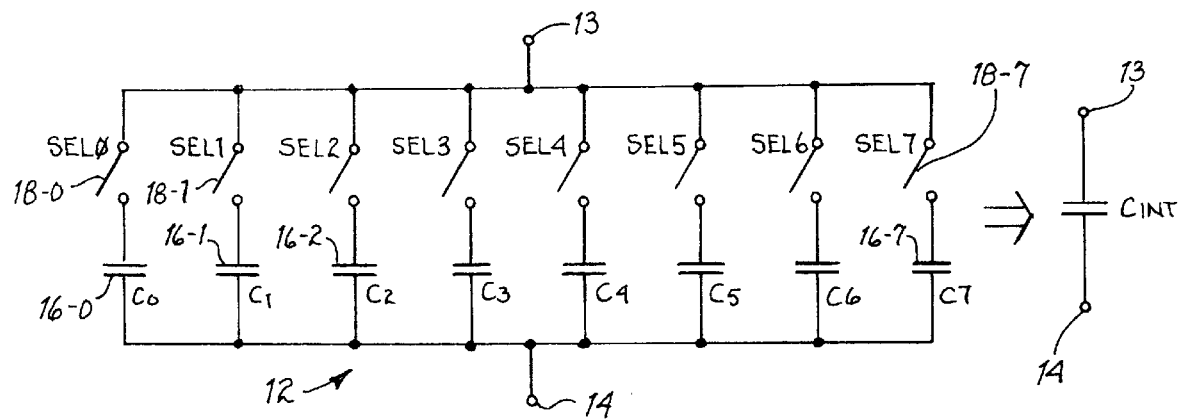
FIG. 2 is a schematic diagram of the binarily weighted capacitor array in block 12 of FIG. 1.
Figure 3:
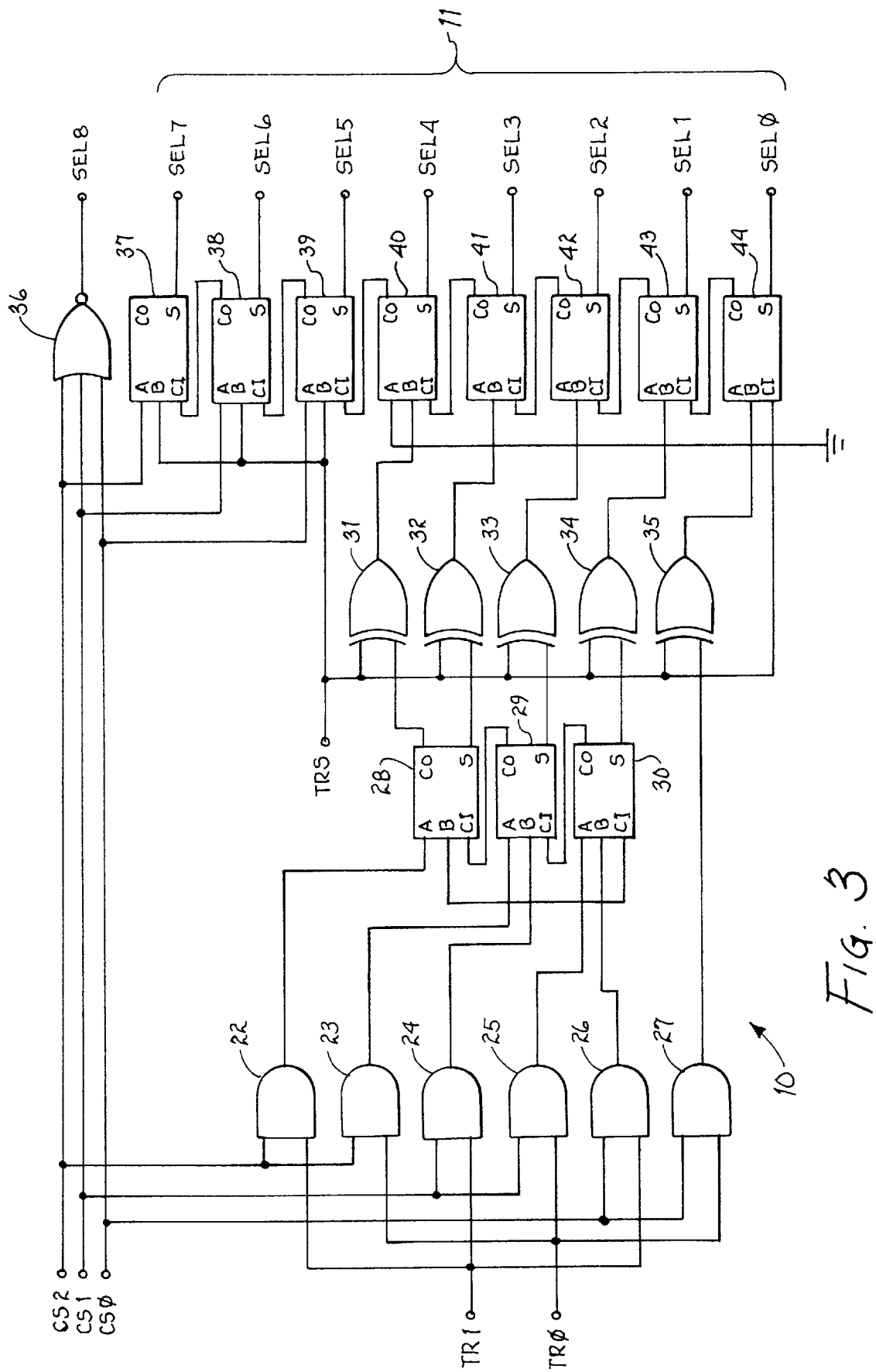
FIG. 3 is a section diagram of the control logic in block 10 of FIG. 1.

As shown in FIG. 2, the binarily weighted capacitor array 12 includes eight binarily weighted capacitors 16-0,1, ... 7 which have capacitances C0, C1, ... C7, respectively, the nominal values of which are indicated in Table 1.

TABLE 1

| NAME | VALUE (NOMINAL) |
|---|---|
| C0 | .390625 pF |
| C1 | .781250 pF |
| C2 | 1.56250 pF |
| C3 | 3.12500 pF |
| C4 | 6.25000 pF |
| C5 | 12.5000 pF |

TABLE 1-continued

| NAME | VALUE (NOMINAL) |
|---|---|
| C6 | 25.000 pF |
| C7 | 50.000 pF |

Note that the absolute values of the capacitances in Table 1 are "ideal" or "nominal" values, but the actual values obtained for capacitors 16-0,1 ... 7 are not well controlled in an ordinary integrated circuit manufacturing process. Therefore, the actual capacitances obtained on any particular semiconductor wafer may need to be, in effect, "trimmed" so that the selected value of $C_{INT}$ actually has the desired value between terminals 13 and 14. Accordingly, the absolute value of $C_{INT}$ is determined by the user-selectable inputs CS0,1,2 together with the manufacturer-selectable trim inputs TR0,1,S which are set during manufacturing to compensate for manufacturing deviations in capacitance per unit area from a nominal value.

Figure 2A:
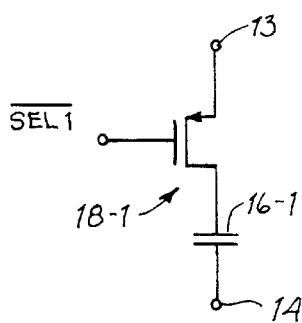
FIG. 2A is a schematic diagram of an implementation of the switches in FIG. 2 using P-channel MOSFETs.
Figure 2B:
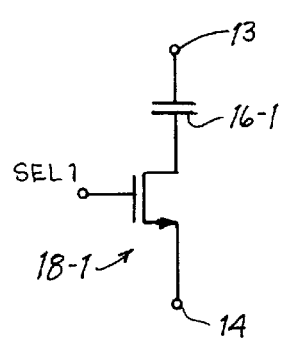
FIG. 2B is a schematic diagram of an implementation of the switches in FIG. 2 using N-channel MOSFETs.
Figure 2C:
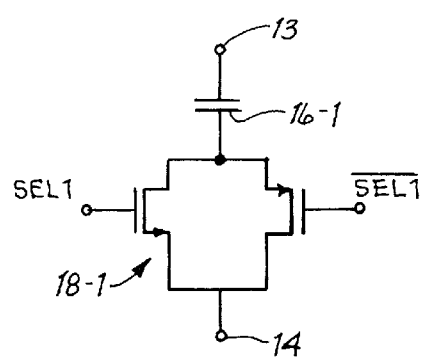
FIG. 2C is a schematic diagram of an implementation of the switches in FIG. 2 using CMOS transmission gates.

Still referring to FIG. 2, each of capacitors 16-0,1 ... 7 has one terminal connected to terminal 14. Capacitor array 12 also includes switches 18-0,1 ... 7 which are controlled by the above mentioned control signals SEL0,1 ... 7, respectively. Each switch 18-0,1 ... 7 is coupled between another terminal of a corresponding capacitor 16-0,1 ... 7 and terminal 13. FIGS. 2A, 2B and 2C show how any of switches 18-0,1 ... 7 can be implemented using P-channel MOSFETs, N-channel MOSFETs, and CMOS transmission gates, respectively.

The three manufacturer-adjustable trim inputs TR0, TR1, and TRS are set by the manufacturer after measuring the actual capacitance per unit area of the capacitors on the semiconductor wafer and then determining the percentage of trimming that would be needed to cause each of the capacitors to have its ideal or nominal value. TR0 and TR1 set the magnitude of the "trimming" needed to offset the percentage deviation of the measured capacitance per unit area from the desired nominal value thereof, and TRS determines the sign (i.e., + or −) of the "trimming", which is opposite to the sign of the deviations from nominal. The manufacturer then sets the needed logic states of TR0, TR1, and TRS using an automated laser to cut links (as subsequently described with reference to FIG. 4) as necessary to offset the manufacturing inaccuracy of the capacitors.

Logic circuit 10 then combines the user-adjustable inputs CS0, CS1, and CS2 and the manufacturer-adjustable trim inputs TR0, TR1, and TRS so that the selected parallel combinations of the values of capacitances indicated in Table 2 with the effective percentage of "trimming" indicated in Table 3 result in the selected or desired value of $C_{INT}$ between terminals 13 and 14.

TABLE 2

| CS2 | CS1 | CS$\phi$ | $C_{INT}$ |
|---|---|---|---|
| 0 | 0 | 0 | Optional External Capacitor |
| 0 | 0 | 1 | 12.5 pF |
| 0 | 1 | 0 | 25.0 pF |
| 0 | 1 | 1 | 37.5 pF |
| 1 | 0 | 0 | 50.0 pF |

TABLE 2-continued

| CS2 | CS1 | CS$\phi$ | $C_{INT}$ |
|-----|-----|----------|-----------|
| 1 | 0 | 1 | 62.5 pF |
| 1 | 1 | 0 | 75.0 pF |
| 1 | 1 | 1 | 87.5 pF |

TABLE 3

| TRS | TR1 | TR$\phi$ | $\Delta C_{INT}$ (%) |
|-----|-----|----------|----------------------|
| 0 | 0 | 0 | None |
| 0 | 1 | 0 | +3% |
| 1 | 0 | 0 | +6% |
| 1 | 1 | 0 | +9% |
| 0 | 0 | 1 | None |
| 0 | 0 | 1 | -3% |
| 1 | 0 | 1 | -6% |
| 1 | 1 | 1 | -9% |

Referring now to FIG. 3, logic circuit 10 includes AND gates 22, 23, 24, 25, 26, and 27. Capacitance selection input CS0 is connected to one input of each of AND gates 26 and 27, and also is connected to one input of a NOR gate 36 and the A input of adder circuit 39. CS1 is connected to one input of each of AND gates 24 and 25 and also to another input of NOR gate 36 and the A input of adder circuit 38. CS2 is connected to one input of each of AND gates 22 and 23, to one input of NOR gate 36, and to the A input of adder circuit 37. Manufacturer-selectable trim input TR0 is connected to one input of each of AND gates 23, 25, and 27. TR1 is connected to one input of each of AND gates 22, 24, and 26. The sign bit TRS is connected to one input of each of exclusive OR gates 31, 32, 33, 34, and 35 and also to the B input of each of adder circuits 37, 38, and 39.

The output of AND gate 22 is connected to the A input of adder circuit 28. The output of AND gate 23 is connected to the A input of adder circuit 29. The output of AND gate 24 is connected to the B input of adder circuit 29. The output of AND gate 25 is connected to the A input of adder circuit 30. The output of AND gate 26 is connected to the B input of adder circuit 30. The output of AND gate 27 is connected to one input of exclusive OR gate 35. The B input of adder circuit 28 and the carry input of adder circuit 30 are connected to ground. The carry output bit of adder circuit 30 is connected to the carry input of adder circuit 29. The carry output of adder circuit 29 is connected to the carry input of adder circuit 28. The sum output of adder 30 is connected to one input of exclusive OR gate 34. The sum output of adder circuit 29 is connected to one input of exclusive OR circuit 33. The sum output of adder circuit 28 is connected to one input of exclusive OR circuit 32, and the carry output of adder circuit 28 is connected to one input of exclusive OR circuit 31. The outputs of exclusive OR circuits 31, 32, 33, 34, and 35 are connected to the B inputs of adder circuits 40, 41, 42, 43, and 44, respectively. The output of NOR gate 36 produces a signal SEL8 which can be used to select an optional external capacitor, as indicated in Table 2. The sum outputs of adder circuits 37, 38, 39, 40, 41, 42, 43, and 44 produce the capacitor array selection signals SEL 7,6, . . . 0, respectively.

Thus, AND gates 22–27 combine with adders 28–30 to, in effect, multiply the user-selected value of capacitance by the percentage of "trimming" needed to compensate for the deviation of actual capacitance per unit area of capacitors 16-0,1 . . . 7 from nominal to obtain an effective "trim capacitance". The minimum increment of trim is 1/K, where K is the ratio of the nominal user-selectable least significant bit capacitance (in the present case, 12.5 pF as indicated in Table 2) divided by the minimum capacitance in the binarily weighted array (in the present case, C0=0.39 pF as indicated in Table 1). Therefore K is equal to 32. So the minimum selectable trim increment is 1÷32, or approximately 3%. Exclusive OR gates 31–35 and the sign input TRS determine whether the trim capacitance is added to or subtracted from the actual capacitance selected by CS0,1,2.

Adder circuits 37–44 form an arithmetic circuit that adds or subtracts a product of the digital number represented by the CS0,1,2 inputs with the digital number represented by the trim inputs TR0,1 to or from the product of the scale factor K and the digital value represented by the CS0,1,2 inputs to produce the selection code to in effect "trim" the user-selected array capacitors to compensate for capacitance per unit area deviations from nominal to produce the user-desired value of $C_{INT}$. The foregoing can be expressed by the equation $$SEL = K \cdot [CS2,1,0] \pm [CS2,1,0]*[TR1,0].$$

This also can be expressed by the exactly-corresponding equation:

$$SEL = K*CAPSEL \pm CAPSEL*TRIM,$$

where CAPSEL=[CS2,CS1,CS0] and TRIM=[TR1,TR0].

AND gates 22–27 and adders 28–30 provide the "CAPSEL*TRIM" function. In particular, 22,23 calculate CS2*[TR1,0]; 24,25 calculate CS1*[TR1,0]; and 26,27 calculate CS0*[TR1,0]. Adders 28–30 add the three individual calculations performed by the AND gates and thereby provide the complete CAPSEL*TRIM result on their outputs.

The TRS input determines whether the CAPSEL*TRIM product is added to or subtracted from K*CAPSEL by adders 37–44. For addition (TRS=0), the CAPSEL*TRIM product is simply added to K*CAPSEL. For subtraction (TRS=1), exclusive OR gates 31–35 and the TRS input generate the negative value of CAPSEL*TRIM in two's complement form. Then this negative number is added to K*CAPSEL. This is due to the fact that the LSB of CAPSEL (CS0 bit) feeds a higher order bit of SEL (bit 5, adder 39). This is effectively multiplying or scaling CAPSEL by K.

To provide X-Y in binary arithmetic, the two's complement representation of "-Y" is generated. Then, -Y (represented in two's complement form) is directly added to X to generate the term X-Y. To represent a negative number represented as a two's complement, the complement of all bits of the corresponding positive number ("Y" in this case) is generated. Then 1 is added to the result. The positive number must be "padded" with leading zeros before taking the inverse or complement.

For example, consider 128-9=119. To obtain this in binary arithmetic, "-9" is represented in two's complement form: 9=1001, in binary, and "padded" with zeros to obtain 00001001. Next, the complement 11110110 is generated. Then +1 is added to obtain 1110111. This result is added to 10000000 (128 in binary form):

10000000 (128)
+11110111 (-9)
101110111 (119) (The carryout bit is discarded.)

A detailed example of subtraction is as follows:
Assume [CS2,1,0]=011 (3 in decimal)
Assume [TR1,0]=11 (3 in decimal)
Assume TRS=1 (subtract—ie, reduce the capacitance)

From the equation, we should get $$SEL = 32*CAPSEL - CAPSEL*TRIM = 32*5 - (3*3) = 151 = 10010111 \text{ in binary.}$$

From the logic:
CAPSEL*TRIM=3*3=9=1001 or 1001 in binary
(This is present on the outputs of adders 28–30.)
The scaled CAPSEL input=32*5=160=101000000 in binary.
The two's complement of "−CAPSEL*TRIM"=two's complement of −9.

$$9=00001001, \text{ So, } -9=11110110+1=11110111$$

The result equals 10100000−1001=10100000 (160)+ 11110111 (−9)=10010111 (151).

Thus, if the manufacturing process capacitance per unit area for capacitors 16-0,1 . . . 7 is measured to be −3% of the nominal value, setting TR1="0", TR0="1", and TRS="0" would, as indicated in Table 3, produce a +3% effective shift in the capacitance of the combination of C5, C6, and C7 actually selected by CS0,1,2. Or, as another example, if the actual measured capacitance per unit area were 9% greater than the nominal value, TR0 and TR1 both would be set to "1" and TRS also would be set to "1", so as to produce a −9% effective shift in the capacitance of the combination of C5, C6 and C7 actually selected by CS0,1,2.

In the present example the minimum trim increment is approximately 3% of the user-selected untrimmed capacitance. The selected capacitance therefore can be trimmed to within ±1.5% of the desired value of $C_{INT}$. For example, if the actual deviation of the array capacitor is 7% above nominal, the "trim" choices are −6% and −9%, as indicated in Table 3. The better choice is −6%, which will result in $C_{INT}$ being 1% above the exact desired value represented by CS0,1,2.

Thus, logic circuit block 10 combines the task of selecting the appropriate capacitors from the capacitor array on the basis of the user capacitance selection inputs and also in effect adjusting the value thereof to compensate for variations in capacitance per unit area as specified by the trim inputs TR0, TR1, and TRS. Logic block 10 also can be implemented as a read only memory or other combinatorial logic which stores the following truth table (Table 4):

TABLE 4

Truth Table

| CS2 | CS1 | CS0 | TR1 | TR0 | TRS | SEL8 | SEL7–SEL0 | |
|---|---|---|---|---|---|---|---|---|
| 0 | 0 | 0 | 0 | 0 | 0 | 1 | 00000000 | (ext cap selected) |
| 0 | 0 | 1 | 0 | 0 | 0 | 0 | 00100000 | |
| 0 | 1 | 0 | 0 | 0 | 0 | 0 | 01000000 | |
| 0 | 1 | 1 | 0 | 0 | 0 | 0 | 01100000 | |
| 1 | 0 | 0 | 0 | 0 | 0 | 0 | 10000000 | |
| 1 | 0 | 1 | 0 | 0 | 0 | 0 | 10100000 | |
| 1 | 1 | 0 | 0 | 0 | 0 | 0 | 11000000 | |
| 1 | 1 | 1 | 0 | 0 | 0 | 0 | 11100000 | |
| 0 | 0 | 0 | 0 | 1 | 0 | 1 | 00000000 | (ext cap selected) |
| 0 | 0 | 1 | 0 | 1 | 0 | 0 | 00100001 | |
| 0 | 1 | 0 | 0 | 1 | 0 | 0 | 01000010 | |
| 0 | 1 | 1 | 0 | 1 | 0 | 0 | 01100011 | |
| 1 | 0 | 0 | 0 | 1 | 0 | 0 | 10000100 | |
| 1 | 0 | 1 | 0 | 1 | 0 | 0 | 10100101 | |
| 1 | 1 | 0 | 0 | 1 | 0 | 0 | 11000110 | |
| 1 | 1 | 1 | 0 | 1 | 0 | 0 | 11100111 | |
| 0 | 0 | 0 | 1 | 0 | 0 | 1 | 00000000 | (ext cap selected) |
| 0 | 0 | 1 | 1 | 0 | 0 | 0 | 00100010 | |
| 0 | 1 | 0 | 1 | 0 | 0 | 0 | 01000100 | |
| 0 | 1 | 1 | 1 | 0 | 0 | 0 | 01100110 | |
| 1 | 0 | 0 | 1 | 0 | 0 | 0 | 10001000 | |
| 1 | 0 | 1 | 1 | 0 | 0 | 0 | 10101010 | |
| 1 | 1 | 0 | 1 | 0 | 0 | 0 | 11001100 | |
| 1 | 1 | 1 | 1 | 0 | 0 | 0 | 11101110 | |
| 0 | 0 | 0 | 1 | 1 | 0 | 1 | 00000000 | (ext cap selected) |
| 0 | 0 | 1 | 1 | 1 | 0 | 0 | 00100011 | |
| 0 | 1 | 0 | 1 | 1 | 0 | 0 | 01000110 | |
| 0 | 1 | 1 | 1 | 1 | 0 | 0 | 01101001 | |
| 1 | 0 | 0 | 1 | 1 | 0 | 0 | 10001100 | |
| 1 | 0 | 1 | 1 | 1 | 0 | 0 | 10101111 | |
| 1 | 1 | 0 | 1 | 1 | 0 | 0 | 11010010 | |
| 1 | 1 | 1 | 1 | 1 | 0 | 0 | 11110101 | |
| 0 | 0 | 0 | 0 | 0 | 1 | 1 | 00000000 | (ext cap selected) |
| 0 | 0 | 1 | 0 | 0 | 1 | 0 | 00100000 | |
| 0 | 1 | 0 | 0 | 0 | 1 | 0 | 01000000 | |
| 0 | 1 | 1 | 0 | 0 | 1 | 0 | 01100000 | |
| 1 | 0 | 0 | 0 | 0 | 1 | 0 | 10000000 | |
| 1 | 0 | 1 | 0 | 0 | 1 | 0 | 10100000 | |
| 1 | 1 | 0 | 0 | 0 | 1 | 0 | 11000000 | |
| 1 | 1 | 1 | 0 | 0 | 1 | 0 | 11100000 | |
| 0 | 0 | 0 | 0 | 1 | 1 | 1 | 00000000 | (ext cap selected) |
| 0 | 0 | 1 | 0 | 1 | 1 | 0 | 00011111 | |
| 0 | 1 | 0 | 0 | 1 | 1 | 0 | 00111110 | |
| 0 | 1 | 1 | 0 | 1 | 1 | 0 | 01011101 | |
| 1 | 0 | 0 | 0 | 1 | 1 | 0 | 01111100 | |
| 1 | 0 | 1 | 0 | 1 | 1 | 0 | 10011011 | |

TABLE 4-continued

Truth Table

| CS2 | CS1 | CS0 | TR1 | TR0 | TRS | SEL8 | SEL7–SEL0 | |
|---|---|---|---|---|---|---|---|---|
| 1 | 1 | 0 | 0 | 1 | 1 | 0 | 10111010 | |
| 1 | 1 | 1 | 0 | 1 | 1 | 0 | 11011001 | |
| 0 | 0 | 0 | 1 | 0 | 1 | 1 | 00000000 | (ext cap selected) |
| 0 | 0 | 1 | 1 | 0 | 1 | 0 | 00011110 | |
| 0 | 1 | 0 | 1 | 0 | 1 | 0 | 00111100 | |
| 0 | 1 | 1 | 1 | 0 | 1 | 0 | 01011010 | |
| 1 | 0 | 0 | 1 | 0 | 1 | 0 | 01111000 | |
| 1 | 0 | 1 | 1 | 0 | 1 | 0 | 10010110 | |
| 1 | 1 | 0 | 1 | 0 | 1 | 0 | 10110100 | |
| 1 | 1 | 1 | 1 | 0 | 1 | 0 | 11010010 | |
| 0 | 0 | 0 | 1 | 1 | 1 | 1 | 00000000 | (ext cap selected) |
| 0 | 0 | 1 | 1 | 1 | 1 | 0 | 00011101 | |
| 0 | 1 | 0 | 1 | 1 | 1 | 0 | 00111010 | |
| 0 | 1 | 1 | 1 | 1 | 1 | 0 | 01010111 | |
| 1 | 0 | 0 | 1 | 1 | 1 | 0 | 01110100 | |
| 1 | 0 | 1 | 1 | 1 | 1 | 0 | 10010001 | |
| 1 | 1 | 0 | 1 | 1 | 1 | 0 | 10101110 | |
| 1 | 1 | 1 | 1 | 1 | 1 | 0 | 11001011 | |

FIG. 4 shows a circuit 20 which generates the manufacturer-adjustable trim signals TR0, TR1, and TRS. In circuit 20, TR0 is generated by a circuit including the polycrystaline silicon resistor 40 connected between $V_{DD}$ and the drain of an N-channel MOSFET 41 having its gate connected to $V_{DD}$ and its source connected to ground. The drain of MOSFET 41 is connected by conductor 44 to the input of an ordinary inverter 43, the output of which produces TR0. Polycrystaline silicon resistor 40 can be selectively cut by a suitable laser mechanism. The resistance of polycrystaline silicon resistor 40 is low enough compared to the resistance of MOSFET 41 to maintain conductor 44 sufficiently close to $V_{DD}$ to maintain TR0 at a "0" if polycrystaline silicon resistor 40 is not laser cut. The series resistance of MOSFETs 41 is high enough to prevent appreciable power dissipation by circuit 20. If polycrystaline silicon resistor 40 is laser cut, MOSFET 41 pull conductor 44 to ground, and inverter 43 produces TR0 as "1". The laser-cuttable circuits for generating TR1 and TRS are identical to the one generating TR0.

An advantage of the above described embodiment of the invention is that if the trim inputs are at their "untrimmed value" the nominal capacitance of the selected combination of capacitors C5,6,7 appears between terminals 13 and 14 without any need for "trimming". Therefore, the "trimming" step of laser-cutting the links to set values of TR0, TR1 or TRS to a "1" can be omitted if the absolute value of capacitance per unit achieved by the manufacturing process is close enough to the nominal value.

Also, the trim inputs TR0,1, and sign input TRS apply to all of the user-adjustable capacitor values on a semiconductor die. Therefore, separate laser cutting of links for each such capacitor array on the semiconductor die are not needed.

Furthermore, the additional capacitors 16-0,1,2,3,4 require relatively little chip area, because their total size is approximately the same as the smallest nominal capacitor, i.e., 16-5, that the user can select.

FIG. 5 shows the programmable capacitor array 1 of FIG. 1 used as an integrating capacitor in a front-end current-to-voltage integrator of a delta-sigma analog-to-digital converter 50. The gain of the front-end integrator is determined by the absolute value of the capacitance $C_{INT}$ between terminals 13 and 14 of selectable capacitance array 1, which is coupled between the inverting input of operational amplifier 55 and the output thereof on conductor 57. A photosensor 51 produces a current $I_{IN}$ which flows into the inverting input of operational amplifier 55. Suitable switches (not shown) can be provided to allow selectable capacitor array 1 to be preset to a value other than zero at the beginning of each integrating cycle. The output of the front end integrating amplifier is sampled by delta-sigma modulator 59, which produces a serial output that is received by a decimation filter 60. Decimation filter 60 produces a digital output signal $D_{OUT}$ which accurately represents the integral of the input current $I_{IN}$ over the integration interval, scaled by the value of the selected capacitance of programmable capacitor array circuit 1.

Note that by applying a known input to current-integrating analog-to-digital converter 50 of FIG. 5, the output thereof can be measured to determine its deviation from a known correct "nominal" output. That deviation will be the same in value and polarity as the deviation of the actual capacitance per unit area of the capacitors in array 12 from the nominal value thereof. Therefore, the values of TR1,2 and TRS needed to accomplish the needed "trimming" can be determined from Table 3.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. For example, it is not essential that the capacitances C0,1, . . . 7 be binarily weighted, they could be weighted in some other manner. The trim inputs and sign input could be generated in other ways, for example by storing corresponding states in an electrically programmable read only memory (EPROM) on an electrically erasable programmable read only memory (EEPROM).

What is claimed is:

1. An integrated circuit capacitor array having first and second ports and presenting a selectable desired capacitance between the first and second ports, comprising in combination:
   (a) a plurality of capacitors each having a first terminal coupled to the first port, and also having a second terminal;

(b) a plurality of switches, each of the switches having a control electrode, a first main electrode, and a second main electrode, the first main electrode of each switch being coupled to the second port, the second main electrode of that switch being coupled to the second terminal of a corresponding one of the capacitors;

(c) a control circuit having a plurality of capacitance selection inputs representing the desired capacitance and a plurality of trim inputs representing a deviation from nominal of the capacitances of the capacitors, the control circuit producing a plurality of selection signals on the control electrodes of the plurality of switches, respectively, in response to the plurality of capacitance selection inputs in conjunction with the plurality of trim inputs to select one or more of the switches and the capacitors coupled thereto to couple the selected capacitors in parallel between the first and second ports and thereby provide between the first and second ports an accurate value of the desired capacitance despite any deviations from nominal of the capacitances of the capacitors.

2. An integrated circuit capacitor array having first and second ports and presenting a selectable desired capacitance between the first and second ports, comprising in combination:

(a) a plurality of capacitors each having a first terminal coupled to the first port, and also having a second terminal;

(b) a plurality of switches, each of the switches having a control electrode, a first main electrode, and a second main electrode, the first main electrode of each switch being coupled to the second port, the second main electrode of that switch being coupled to the second terminal of a corresponding one of the capacitors;

(c) a control circuit having a plurality of capacitance selection inputs representing the desired capacitance, a plurality of trim inputs representing a deviation from nominal of the capacitances of the capacitors, and a sign input, the control circuit producing a plurality of selection signals on the control electrodes of the plurality of switches, respectively, in response to the plurality of capacitance selection inputs in conjunction with the plurality of trim inputs and the sign input to select one or more of the switches and the capacitors coupled thereto to couple the selected capacitors in parallel between the first and second ports and thereby provide between the first and second ports an accurate value of the desired capacitance despite any deviations from nominal of the capacitances of the capacitors.

3. The integrated circuit capacitor array of claim 2 wherein the value of a digital code represented by the plurality of trim inputs represents the percentage deviation of the capacitance per unit area of the capacitors.

4. The integrated circuit capacitor array of claim 3 wherein the sign input represents an algebraic sign opposite to the polarity of the deviation of the capacitance per unit area of the capacitors.

5. The integrated circuit capacitor array of claim 4 wherein the plurality of capacitors are binarily weighted.

6. The integrated circuit capacitor array of claim 4 wherein the plurality of capacitance selection inputs are external inputs of an integrated circuit including the integrated circuit capacitor array to select one of a predetermined number of desired values of capacitance to appear between the first and second ports, each of the desired values corresponding to a different combination of logic states of the plurality of capacitance selection inputs.

7. The integrated circuit capacitor array of claim 6 wherein the plurality of trim inputs and the sign input are internal inputs of the integrated circuit and are settable during manufacture of the integrated circuit to couple a selectable combination of the capacitors in parallel.

8. The integrated circuit capacitor array of claim 7 including a plurality of circuits producing the plurality of trim inputs and the sign input, respectively, according to whether or not a link in each of the circuits is cut.

9. The integrated circuit array of claim 8 wherein each of the circuits includes a polycrystaline silicon resistor which causes the circuit to produce a "1" if the polycrystaline silicon resistor is cut through by a laser and a "0" if the polycrystaline silicon resistor is not cut.

10. The integrated circuit capacitor array of claim 5 wherein the control circuit produces the selection signals according to the expression $$SEL = K * CAPSEL \pm CAPSEL * TRIM,$$

wherein:

K is a scale factor equal to a ratio of a nominal user-selectable least significant bit capacitance divided by the minimum capacitance in the array, CAPSEL is a binary number representing the logical states of the plurality of capacitance selection inputs, TRIM is a binary number representing the logical states of the plurality trim inputs, and TRS determines whether $\pm$ is plus or minus.

11. The integrated circuit capacitor array of claim 10 wherein the control circuit includes a stored look-up table of values of SEL corresponding to various combinations of values of the binary numbers CAPSEL, TRIM and TRS.

12. The integrated circuit capacitor array of claim 10 wherein the control circuit includes i. a plurality of capacitance selection inputs, a plurality of trim inputs, and a sign input;

ii. a plurality of gates performing a logical ANDing function on various combinations of the capacitance selection inputs and the trim inputs;

iii. a first adder summing outputs of the ANDing function gates to produce a digital number representing a digital product of the capacitance selection inputs and the trim inputs;

iv. a circuit receiving the digital number and the sign input and performing an exclusive ORing function to combine the sign input with the digital number; and v. a second adder which in accordance with the sign input effectively adds or subtracts the digital number to or from a digital number representing the capacitances selection inputs and the sign input to provide between the first and second ports an accurate value of the desired capacitance selected by the plurality of capacitance selection inputs.

13. An integrated circuit capacitor array having first and second ports and presenting a selectable desired capacitance between the first and second ports, comprising in combination:

(a) a plurality of capacitors each having a first terminal coupled to the first port and also having a second terminal;

(b) a plurality of switches, each of the switches having a control electrode, a first main electrode coupled to the second port, and a second main electrode coupled to the second terminal of a corresponding one of the capacitors, respectively;

(c) a control circuit including
  i. a plurality of capacitance selection inputs, a plurality of trim inputs, and a sign input;
  ii. a plurality of gates performing a logical ANDing function on various combinations of the capacitance selection inputs and the trim inputs;
  iii. a first adder summing outputs of the ANDing function gates to produce a digital number representing a digital product of the capacitance selection inputs and the trim inputs;
  iv. a circuit receiving the digital number and the sign input and performing an exclusive ORing function to combine the sign input with the digital number; and
  v. a second adder which in accordance with the sign input effectively adds or subtracts the digital number to or from a digital number representing the capacitances selection inputs and the sign input to provide between the first and second ports an accurate value of the desired capacitance selected by the plurality of capacitance selection inputs despite deviations from nominal of the capacitance per unit area of the capacitors.

14. An integrated circuit current-to-voltage integrator, comprising in combination:
  (a) an operational amplifier having an inverting input, a non-inverting input coupled to a reference voltage conductor, and an output;
  (b) a capacitor array having first and second ports and presenting a selectable desired capacitance between the first and second ports, the first port being coupled to the inverting input and the second port being coupled to the output, the capacitor array including
    i. a plurality of capacitors each having a first terminal coupled to the first port and also having a second terminal;
    ii. a plurality of switches, each of the switches having a control electrode, a first main electrode coupled to the second port, and a second main electrode coupled to the second terminal of a corresponding one of the capacitors, respectively; and
    iii. a control circuit having a plurality of capacitance selection inputs representing the desired capacitance, a plurality of trim inputs representing a deviation from nominal of the capacitances of the capacitors, and a sign input, the control circuit producing a plurality of selection signals on the control electrodes of the plurality of switches, respectively, in response to the plurality of capacitance selection inputs in conjunction with the plurality of trim inputs and the sign input to select one or more of the switches and the capacitors coupled thereto to couple the selected capacitors in parallel between the first and second ports and thereby provide between the first and second ports an accurate value of the desired capacitance despite any deviations from nominal of the capacitances of the capacitors.

15. A method of providing an accurate integrated circuit programmable capacitor array with a plurality of selectable values of capacitance between a first port and a second port despite manufacturing variations in the capacitance of individual capacitors in the array, the method comprising the steps of:
  (a) providing in the array a plurality of capacitors each having a first terminal coupled to the first port, and also having a second terminal, and also providing a plurality of switches, each of the switches having a control electrode, a first main electrode, and a second main electrode, the first main electrode of each switch being coupled to the second port, the second main electrode of that switch being coupled to the second terminal of a corresponding one of the capacitors;
  (b) obtaining a value representing a percentage deviation from nominal of the capacitors in the array;
  (c) setting values of a plurality of trim inputs to represent the percentage deviation;
  (d) setting values of a plurality of capacitance selection inputs to represent a predetermined value of desired capacitance between the first and second ports;
  (e) in response to the capacitance selection inputs the trim inputs, producing a plurality of selection signals on the control electrodes of the plurality of switches, respectively, according to the expression:

$$SEL = K*CAPSEL + CAPSEL*TRIM,$$

wherein:
  K is a scale factor equal to a ratio of a nominal user-selectable least significant bit capacitance divided by the minimum capacitance in the array,
  CAPSEL is a binary number representing the logical states of the plurality of capacitance selection inputs, and
  TRIM is a binary number representing the logical states of the plurality trim inputs.

16. The method of claim 15 wherein a sign input determines whether a number represented by the trim inputs is positive or negative.

17. The method of claim 16 wherein step (e) includes
  i. performing a logical ANDing function on various combinations of the capacitance selection inputs and the trim inputs;
  ii. summing outputs of the ANDing function to produce a digital number representing a digital product of the capacitance selection inputs and the trim inputs;
  iii. performing an exclusive ORing function to combine the sign input with the digital number; and
  iv. adding or subtracting the digital number to or from a digital number representing the capacitances selection inputs and the sign input to provide between the first and second ports an accurate value of the desired capacitance selected by the plurality of capacitance selection inputs.

18. A method of providing an accurate integrated circuit programmable capacitor array with a plurality of selectable values of capacitance between a first port and a second port despite manufacturing variations in the capacitance of individual capacitors in the array, the method comprising the steps of:
  (a) providing in the array a plurality of capacitors each having a first terminal coupled to the first port, and also having a second terminal, and also providing a plurality of switches, each of the switches having a control electrode, a first main electrode, and a second main electrode, the first main electrode of each switch being coupled to the second port, the second main electrode of that switch being coupled to the second terminal of a corresponding one of the capacitors;
  (b) obtaining a value representing a percentage deviation from nominal of the capacitors in the array;
  (c) setting values of a plurality of trim inputs to represent the percentage deviation;

(d) setting values of a plurality of capacitance selection inputs to represent a predetermined value of desired capacitance between the first and second ports; and (e) in response to the capacitance selection inputs and the trim inputs, producing a plurality of selection signals on the control electrodes of the plurality of switches.

19. The method of claim 18 wherein a sign input determines whether a number represented by the trim inputs is positive or negative.

20. The method of claim 19 wherein step (e) includes i. performing a logical ANDing function on various combinations of the capacitance selection inputs and the trim inputs;

ii. summing outputs of the ANDing function to produce a digital number representing a digital product of the capacitance selection inputs and the trim inputs;

iii. performing an exclusive ORing function to combine the sign input with the digital number; and iv. adding or subtracting the digital number to or from a digital number representing the capacitances selection inputs and the sign input to provide between the first and second ports an accurate value of the desired capacitance selected by the plurality of capacitance selection inputs.

* * * * *